United States Patent [19]

Guthrie

[11] Patent Number: 5,343,168
[45] Date of Patent: Aug. 30, 1994

[54] HARMONIC FREQUENCY SYNTHESIZER WITH ADJUSTABLE FREQUENCY OFFSET

[75] Inventor: Warren E. Guthrie, Glen Ellyn, Ill.

[73] Assignee: Northrop Grumman Corporation, Los Angeles, Calif.

[21] Appl. No.: 89,955

[22] Filed: Jul. 9, 1993

[51] Int. Cl.$^5$ .......................... H03L 7/06; H03L 7/16
[52] U.S. Cl. ........................................ 331/16; 331/18; 331/25
[58] Field of Search .................. 331/16, 19, 25, 18, 331/28, 76; 455/260

[56] References Cited

U.S. PATENT DOCUMENTS

| | | | |
|---|---|---|---|
| 3,277,390 | 10/1966 | McLin | 331/25 |
| 3,379,993 | 4/1968 | Berman | 331/19 X |
| 4,008,443 | 2/1977 | Remy | 331/38 |
| 4,105,949 | 8/1978 | Hardin | 331/37 |
| 4,198,604 | 4/1980 | Holdaway | 331/22 X |
| 4,513,448 | 4/1985 | Maher | 331/25 X |
| 4,568,888 | 2/1986 | Kimura et al. | 331/10 |
| 4,573,023 | 2/1986 | Cok et al. | 331/25 X |
| 4,603,304 | 7/1986 | Burns et al. | 331/2 |
| 4,682,122 | 7/1987 | Remy et al. | 331/2 |
| 4,791,377 | 12/1988 | Grandfield et al. | 331/40 X |
| 4,827,225 | 5/1989 | Lee | 331/10 |
| 4,868,510 | 9/1989 | Goldberg | 331/40 X |
| 4,878,027 | 10/1989 | Carp et al. | 331/40 X |
| 4,878,035 | 10/1989 | Vendely et al. | 332/101 |
| 4,882,549 | 11/1989 | Galani et al. | 331/16 X |
| 4,912,432 | 3/1990 | Galani et al. | 331/2 |
| 4,965,534 | 10/1990 | McKinney et al. | 331/37 |
| 5,015,971 | 5/1991 | Taylor et al. | 331/16 |
| 5,184,093 | 2/1993 | Itoh et al. | 331/25 |

*Primary Examiner*—David Mis
*Attorney, Agent, or Firm*—Terry J. Anderson; Robert B. Block; Karl J. Hoch, Jr.

[57] ABSTRACT

A frequency synthesizer having a comb frequency generator, comb line selection filter, and phase locked loop for filtering out spurious signal components and for offsetting the synthesizer output frequency from the frequency of a signal which is output by the comb line selection filter. A reference signal source generates a reference signal having a reference frequency and outputs the reference signal to the comb frequency generator. The comb frequency generator outputs a plurality of comb spectrum signals having frequencies which are respective integer multiples of the reference frequency. An input mixer connected to the comb frequency generator and to a coarse tuning signal source translates the frequencies of the comb spectrum signals to place one selected signal of the comb spectrum signals within a pass band of the comb line selection filter, which outputs the selected signal to the phase locked loop. The phase locked loop includes a voltage controlled oscillator (VCO) which generates an output signal in response to the selected comb spectrum signal and in response to a feedback signal generated by a single sideband (SSB) mixer circuit receiving a portion of the VCO output signal. A fine tuning signal source is connected to the SSB mixer circuit and provides a fine tuning signal to the SSB mixer to shift the VCO output signal frequency by the amount of the frequency of the fine tuning signal, that amount being less than the frequency spacing of the comb spectrum signals. An output mixer receives the VCO output signal and the coarse tuning signal to shift the frequency of the VCO output signal in a direction opposite to the frequency translation of the comb spectrum signals to establish the desired frequency of the synthesized frequency signal.

7 Claims, 5 Drawing Sheets

HARMONIC FREQUENCY SYNTHESIZER WITH ADJUSTABLE FREQUENCY OFFSET

BACKGROUND OF THE INVENTION

This invention relates to a frequency synthesizer and, more particularly, to a synthesizer employing a comb or harmonic frequency generator with comb frequency line selection and a phase locked loop (PLL) for filtering out spurious signal components, the synthesizer having a single side band mixer within the PLL for offsetting the output frequency of the synthesizer from a comb frequency line.

Synthesizers of high frequencies, in the gigahertz range by way of example, frequently employ a phase locked loop to stabilize the output signal frequency, and include also circuitry for down conversion in frequency of a sample of the output signal to enable use of lower frequency circuit components, such as those operating in the megahertz range, for phase locking the output signal to an input reference signal. Generally, it has been the practice to employ a frequency divider comprising one or more digital counters to accomplish the down conversion of frequency.

In the operation of the frequency divider, the counters divide both the frequency and the phase of the sample of the output signal. This operation is satisfactory for many applications, but suffers from a limitation in that there may be excessive phase noise in-the output signal for applications requiring a precision output signal. For example, in the case of a divider which divides the frequency and the phase by a factor of ten for presentation to a phase detector of the phase locked loop, a phase deviation at the low frequency end of the divider is one tenth that at the high frequency end of the divider. Correspondingly, the phase noise power at the output signal is greater than the phase noise power at the input to the phase detector by a factor of 100 (20 decibels).

It is desirable to employ a harmonic or comb frequency generator to obtain the desired output frequency of the synthesizer because the output frequency is then known accurately as an integral multiple of an input reference frequency. However, the use of the aforementioned down conversion with a comb spectrum may introduce aliasing with consequent difficulty in extraction of the desired signal frequency. Furthermore, it is generally necessary to provide the capability to offset an output frequency of the synthesizer from the frequency values of the comb frequency lines.

Thus, there are problems in the construction of a frequency synthesizer employing a comb frequency generator and a frequency divider. In the case of the comb frequency generator, there may be the aforementioned difficulty in the down conversion and in the offsetting of output frequency from a comb line. Furthermore, use of a frequency divider in a phase locked loop introduces a phase noise in the output signal which may be excessive for generation of precision frequency in the output signal. Filtering of spurious signals within a sequence of counters of a divider has not been possible, generally, because of the need for constructing the divider with wide bandwidth to accommodate a wide range of output frequencies from the synthesizer.

SUMMARY OF THE INVENTION

The aforementioned problems are overcome and other advantages are provided by a frequency synthesizer comprising, in accordance with the invention, a phase locked loop (PLL) having a phase detector outputting a control signal, a voltage controlled oscillator outputting an output signal in response to the control signal, a coupler for extracting a portion of the output signal, and a single sideband (SSB) mixer circuit connected between the coupler and the phase detector for providing a feedback signal responsive to the extracted output signal to a first input terminal of the phase detector.

An input signal for selection of the VCO frequency is applied to a second input terminal of the phase detector and is attained, in accordance with a feature of the invention, by means of a comb-frequency generator operating in response to a reference signal having a reference frequency outputted by a reference signal source. The comb-frequency generator outputs a plurality of comb frequency signals having frequencies which are respective integer multiples of the reference frequency. The synthesizer also includes a filter assembly connected between the comb-frequency generator and the second input terminal of the phase detector for selecting a signal outputted by the comb-frequency generator at one frequency of the comb spectrum frequencies. The filter assembly applies the selected signal as the input signal to the phase detector for control of the VCO output frequency.

To enable selection of a desired frequency of the comb spectrum frequencies by the filter assembly, the synthesizer further comprises, in accordance with a further feature of the invention, tuning circuitry having a tuning signal generator, and an input mixer connected between the comb-frequency generator and the filter assembly for mixing the comb spectrum frequencies with a tuning signal of the tuning signal generator. This translates the comb spectrum frequencies to place a signal of the comb-frequency generator within a pass band of a filter of the filter assembly. Also included in the synthesizer circuitry is an output mixer connected to the tuning signal generator and the coupler to translate the output frequency of the VCO in a direction opposite to the direction of translation of the comb spectrum frequencies, thereby to establish the desired frequency for the output frequency of the VCO.

In order to fine tune the VCO, there is included within the synthesizer an offset-signal generator which applies an offset signal to the SSB mixer circuit. There results an offsetting of the frequency of the signal coupled between the coupler and the first input terminal of the phase detector. In a preferred embodiment of the invention, an SSB mixer of the mixer circuit operates to shift the VCO frequency by the amount of the frequency of the offset signal, this amount being less than a frequency spacing of the comb spectrum frequencies.

The SSB mixer circuit comprises an SSB mixer, a band-pass filter for attenuating spurious spectral lines of a signal outputted by the SSB mixer, and a first frequency divider which are connected in series between the coupler and the first input terminal of the phase detector. The first frequency divider comprises, typically, a series of digital counters which may be placed on one side of the SSB mixer or, alternatively, some of the counters may be placed on one side of the SSB mixer with the remainder on the other side of the SSB mixer. Similarly, with respect to the band-pass filter, some of the counters may be placed on one side of the band-pass filter with the remainder on the other side of the band-pass filter.

The filter assembly comprises a band selection filter for passing one signal of the comb spectrum signals while attenuating spurious spectral lines of a signal outputted by the input mixer, and a second frequency divider which are connected in series between the input mixer and the second input terminal of the phase detector. The second frequency divider is constructed in the same fashion as the first frequency divider with a series of digital counters which may follow the band selection filter or, alternatively, a further band pass filter may be located within the series of counters with some of the counters being placed on one side of the band selection filter and the remainder on the other side of the band selection filter. In a preferred embodiment of the invention, the frequency division ratio of the first frequency divider is equal to the frequency division ratio of the second frequency divider.

BRIEF DESCRIPTION OF THE DRAWING

The aforementioned aspects and other features of the invention are explained in the following description, taken in connection with the accompanying drawing wherein.

DETAILED DESCRIPTION

Figure 1:
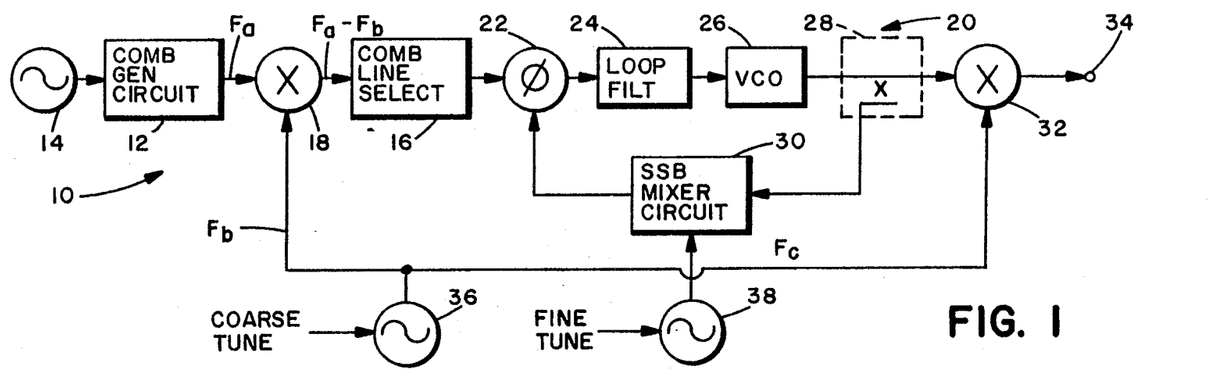
FIG. 1 is a simplified block diagram of a frequency synthesizer constructed in accordance with the invention.

FIG. 1 shows a simplified form of a frequency synthesizer 10 of the invention wherein a comb line generation circuit 12 provides a set of comb spectrum signals having comb spectrum frequencies of which the frequencies are respective integer multiples of a reference signal frequency supplied to the comb line generation circuit 12 by a reference signal source 14. The synthesizer 10 further comprises a comb line selector 16 coupled via an input mixer 18 to an output terminal of the comb line generation circuit 12 for selecting a single comb spectrum signal from the comb spectrum signals of the comb line generation circuit 12. Also included in the synthesizer 10 is a phase locked loop (PLL) 20 comprising a phase detector 22, a loop filter 24, a voltage controlled oscillator (VCO) 26, a microwave coupler 28, and a single sideband (SSB) mixer circuit 30. The SSB mixer circuit 30 is disposed in a feedback path of the PLL 20 between the coupler 28 and a first input terminal of the phase detector 22, a second input terminal of the phase detector 22 being connected to an output terminal of the selector 16. The phase detector 22 forms the difference between the phases of an output signal of the selector 16 and a feedback signal of the mixer circuit 30 to output a loop error signal which is filtered by the filter 24. The loop filter 24 is constructed in accordance with well-known practice in the design of phase-locked loops, and may include, by way of example, lead-lag filter components to provide a control signal for the VCO 26. The voltage of the control signal establishes the value of a frequency outputted by the VCO 26 to the coupler 28. An output mixer 32 connects the coupler 28 to an output terminal 34 of the synthesizer 10. A coarse tuning signal source 36 applies a common sinusoidal signal at a preselected frequency to reference input terminals of both the input and the output mixers 18 and 32. A fine tuning signal source 38 applies a sinusoidal signal at a preselected frequency to a reference input terminal of the SSB mixer circuit 30.

In the operation of a preferred embodiment of the synthesizer 10, the frequency of the coarse tuning source 36 is subtracted, at the input mixer 18, from the frequencies of the respective comb spectrum signals outputted by the comb line generation circuit 12. This serves to translate the comb spectrum signals downwards to a lower set of frequencies, one of which falls within a passband of the selector 16. Thereby, the selector 16 is able to select one of the plurality of comb spectrum signals. The passband of the selector 16 is set to a desired value of frequency useful in operation of the phase detector 22. For example, in the preferred embodiment of the invention, the comb line generation circuit 12 outputs comb spectrum signals having frequencies lying in a range of 9–15 GHz (gigahertz) with a frequency spacing in a range of approximately 300–400 MHz (megahertz), a value of 360 MHz having been used in the preferred embodiment. The passband of the selector 16 lies at an intermediate frequency (IF) in a range of approximately 6–7 GHz, a value of 6.435 GHz having been used in the preferred embodiment. The output frequency of the VCO is equal, apart from a relatively small offset introduced by the fine tuning source 38 and the mixer circuit 30, to the frequency of the IF signal in the passband of the selector 16.

The coupler 28 serves to couple substantially all of the power outputted by the VCO to the output mixer 32, a relatively small fraction of the outputted power, such as −20 dB (decibels) by way of example, being coupled by the coupler 28 to the mixer circuit 30. The output mixer 32 is operative to sum the frequency of the coarse tuning source 36 with the frequency of the VCO signal to translate the VCO signal upwardly, in the direction opposite the translation of the comb spectrum by the input mixer 18. The upward translation of the spectrum regains the value of the frequency of the selected comb spectrum signal at the output terminal 34, apart from the relatively small offset of the fine tuning frequency of the source 38. Adjustment of the value of frequency of the coarse tuning source 36 serves to adjust the amount of translation of the comb spectrum frequencies outputted by the comb generation circuit 12, thereby to select a specific value of the comb spectrum frequencies to be captured by the passband of the selector 16.

The SSB mixer circuit 30 may be operated to sum the fine tuning frequency with the sample of the VCO frequency extracted by the coupler 28, or to subtract the value of fine tuning frequency from the VCO frequency, so as to offset the VCO frequency from the frequency of the signal in the passband of the selector 16. The excursion in the fine tuning frequency is sufficient to alter the output frequency of the synthesizer 10 at the terminal 34 within a range of values approximately equal to the spacing of the comb spectrum frequencies. The excursion in the coarse tuning frequency is sufficient to alter the output frequency of the synthesizer 10 at the terminal 34 over a range of values exceeding the spacings of a plurality of the comb spectral frequencies. Use of both the coarse and the fine tuning sources 36 and 38 enables an operator of the synthesizer 10 to select a desired frequency over a large band of frequencies encompassing many frequencies of the comb spectrum signals. For example, in the preferred embodiment of the synthesizer 10, a choice of frequencies at the terminal 34 extending over a range of 9-15 GHz is attained.

It should be noted also that, in accordance with the invention, the synthesizer 10 could be constructed without the SSB mixer circuit 30, in which case the sample of the VCO signal extracted by the coupler 28 would be applied directly to the phase detector 22. In this case adjustment of the frequency of the VCO 26 could be accomplished by adjustment of the frequency of the source 14. However, use of the SSB mixer circuit 30 is preferred in a situation wherein a fine tuning capability is desired.

Figure 2:
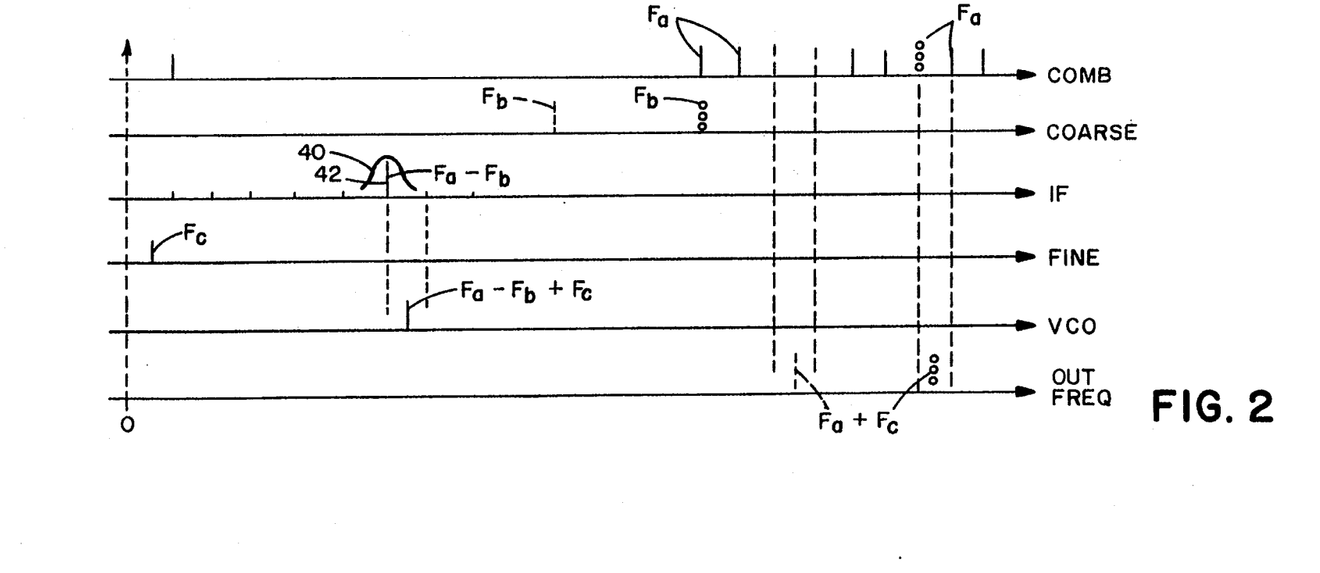
FIG. 2 is a set of graphs presenting spectra useful in explaining operation of the frequency synthesizer of FIG. 1.

The inventive features of employing both the coarse tuning source 36 and the fine tuning source 38 for obtaining a desired output frequency is explained with reference to FIG. 2. The comb spectrum signals of the comb generation circuit 12 are represented in the first graph of FIG. 2 by a set of lines, each line representing a single frequency Fa. The coarse frequency tuning signal, presented in the second graph, may have any one of a plurality of values, Fb, of which two such values are shown. All of the graphs of FIG. 2 show frequency, and are positioned in registration with each other. To facilitate the explanation, two of the frequencies Fa of the first graph are specifically identified, by way of example, and are indicated as a dashed line and as a dotted line. The corresponding two values of the tuning frequency Fb in the second graph are similarly identified by dashed and dotted lines. The comb line selector 16 has an IF passband 40 shown diagrammatically in the third graph of FIG. 2. In the operation of the synthesizer 10, a value of course tuning frequency is chosen to translate a desired frequency Fa of the comb spectrum to fall within the passband 40, shown at frequency line 42. This is indicated in FIG. 2 as the difference frequency Fa−Fb produced by the input mixer 18. For example, to translate the dashed comb line Fa to IF, the requisite value of the tuning frequency Fb is the dashed tuning line Fb. Similarly, the dotted line value of Fb is employed to translate the dotted line value of Fa to IF.

The value of the fine tuning frequency is shown in the fourth graph of FIG. 2 and is indicated as Fc. The PLL 20 is operative to output a signal having a frequency equal to the IF spectral line 42, apart from the offset of the fine tuning frequency Fc as shown in the fifth graph of FIG. 2. Thus, the VCO outputs a signal with frequency Fa−Fb+Fc wherein the SSB mixer circuit 30 is assumed to subtract the frequency Fc from the VCO output frequency. Upon translation of the VCO frequency upward, at the output mixer 32, by use of the same value of Fb employed in the downward translation of the second and the third graphs, there is obtained the output frequency Fa −Fb+Fb+Fc=Fa+Fc as shown in the last graph of FIG. 2. Thus, the value of the coarse tuning frequency Fb cancels out, and does not appear in the expression for the output frequency of the synthesizer 10. This cancellation of the coarse tuning frequency Fb is an important feature of the invention because it allows for accurate selection of the output frequency without requiring an accurate value for the coarse tuning frequency, it being a sufficient accuracy for the coarse tuning frequency to place the IF line 42 approximately in the center of the passband 40. The bandwidth of the PLL 20 is much narrower than the IF passband 40 so as to filter out any spurious frequency components falling within the passband 40 of the selector 16 due to the mixing operation of the input mixer 18.

Figure 3:
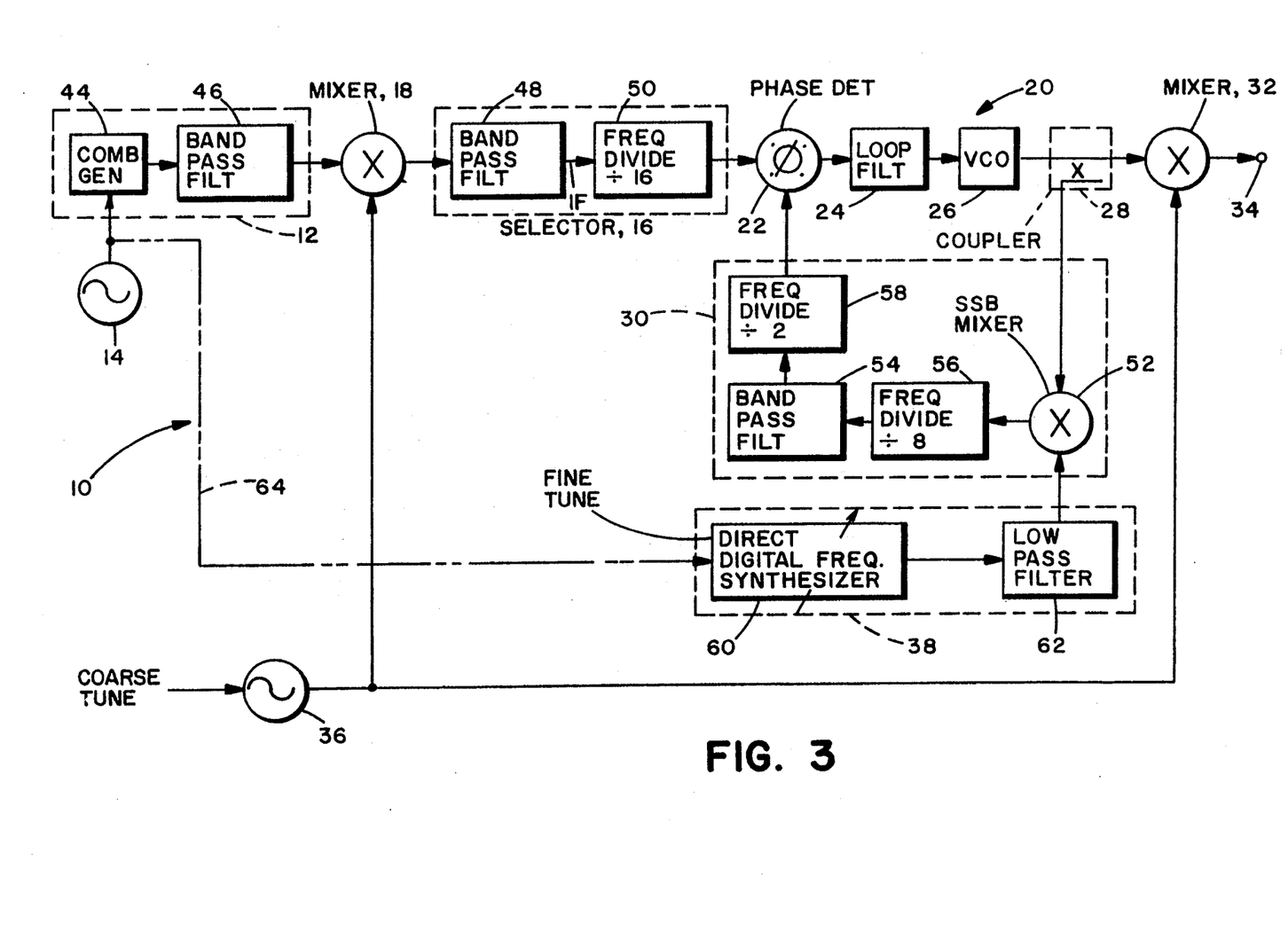
FIG. 3 is a block diagram, similar to that of FIG. 1, but showing further detail in the construction of the invention.

FIG. 3 shows further details in the construction of the preferred embodiment of the synthesizer 10. The comb generation circuit 12 comprises a comb line generator 44 and a band pass filter 46 connected between an output terminal of the generator 44 and an input terminal of the input mixer 18 for limiting the number of the comb spectrum frequencies to be employed in the operation of the synthesizer 10. The comb line selector 16 comprises a band pass filter 48 connected to an output terminal of the input mixer 18 and a frequency divider 50 connected to an output terminal of the filter 48. The divider 50 has a frequency division ratio of 16. The filter 48 provides the passband 40 shown in FIG. 2.

The mixer circuit 30 comprises an SSB mixer 52, a band pass filter 54, a frequency divider 56 having a frequency division ratio of 8 and a frequency divider 58 having a frequency division ratio of 2. The total division ratio of the combination of the two dividers 56 an 58 equals 16, the division ratio of the divider 50. It is noted that the division ratio of 16 is employed by way of example, and that other values of division ratio may be employed. The fine tuning signal source 38 comprises a direct digital frequency synthesizer (DDS) 60 and a low pass filter 62 connected between an output terminal of the DDS 60 and an input terminal of the SSB mixer 52. In the event that the capability in the synthesizer 10 for fine tuning is not required, then the SSB mixer 52 and the fine tuning signal source 38 may be deleted in which case the frequency divider 56 would be connected directly to the coupler 28 for receiving the sample of the VCO signal.

In accordance with a feature of the invention, it is desirable to operate the phase detector 22 at a frequency which is relatively low, as compared to output frequency of the synthesizer 10, thereby to enable the use of a low frequency phase detector rather than a phase detector specially constructed to operate in the gigahertz range of microwave frequencies. The translation of a desired comb spectrum frequency of the comb generator 44 by the input mixer 18 to the lower intermediate frequency of the selector 16 aids in reducing the frequency requirements of the phase detector 22. However, in accordance with a further feature of the invention, the operating frequency requirements of the phase detector 22 can be reduced still further by use of the frequency divider 50 of the selector 16 and the corresponding set of frequency dividers 56 and 58 of the mixer circuit 30. These dividers allow the operating frequency requirements of the phase detector 22 to be reduced by a factor of 16 to provide, in the preferred embodiment of the invention, an operating frequency of approximately 400 MHz for the phase detector 22. It is understood that other reduction ratios may be employed by use of other frequency division ratios. The output frequency of the VCO 26 has a nominal value 16 times greater, namely, 6400 MHz plus an offset in the range of 180-360 MHz (by way of example in the preferred embodiment of the synthesizer 10) due to a mixing of the VCO signal with the fine tuning signal of the source 38.

In the mixer circuit 30, the mixer 52 mixes the fine tuning signal of the source 38 with the sample of the output signal of the VCO 26 provided by the coupler 28. By way of example, it is assumed that the mixer 52 is operative to subtract the fine tuning frequency from the VCO frequency, and to output the difference frequency signal to the divider 56. The difference frequency then is divided by a factor of 8 at the divider 56, and the difference frequency signal is passed on to the filter 54. The filter 54 has a passband which is sufficiently narrow to filter out spurious frequency components resulting from the mixing operation in the mixer 52 including effects of the division by the divider 56. The signal passed by the filter 54 is applied via the divider 58 to the phase detector 22, the divider 58 serving to divide the frequency by another factor of 2. Since the signal of the DDS 60 is applied to the PLL 20 at a location before the frequency division of the dividers 56 and 58, spurious frequency components, or spurs, resulting from the mixing operation of the mixer 52 are decreased in amplitude before application to the phase detector.

The DDS 60 operates with a reference signal to provide the fine tuning signal at a selectable frequency. The output signal of the DDS 60 is applied via the filter 62 to the mixer 52. The filter 62 has a cut-off frequency immediately above the highest value of the fine tuning frequency to facilitate attenuation of any harmonics or spurious frequency components produced by operation of the direct digital frequency synthesizer 60. A local oscillator (not shown) may be employed to provide the reference signal to the DDS 60, if desired or, alternatively, the output signal of the signal source 14 may be coupled to an input terminal of the DDS 60 as shown by line 64. Use of the source 14 to drive the DDS 60 phase locks the comb generator 44 to the DDS. By way of example, the source 14 may output a signal frequency of 360 MHz, the DDS 60 may output a signal frequency in the range of 180-360 MHz, and the low pass filter 62 may have a corresponding cut off frequency of 360 MHz.

Figure 4:
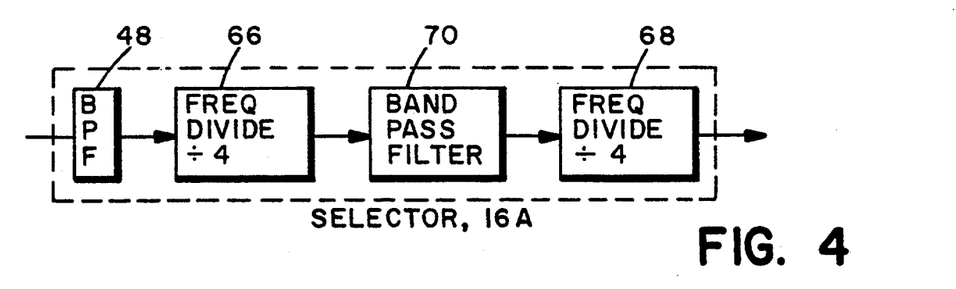
FIG. 4 is shows diagrammatically a further embodiment of a comb line selector of FIG. 3.
Figure 5:
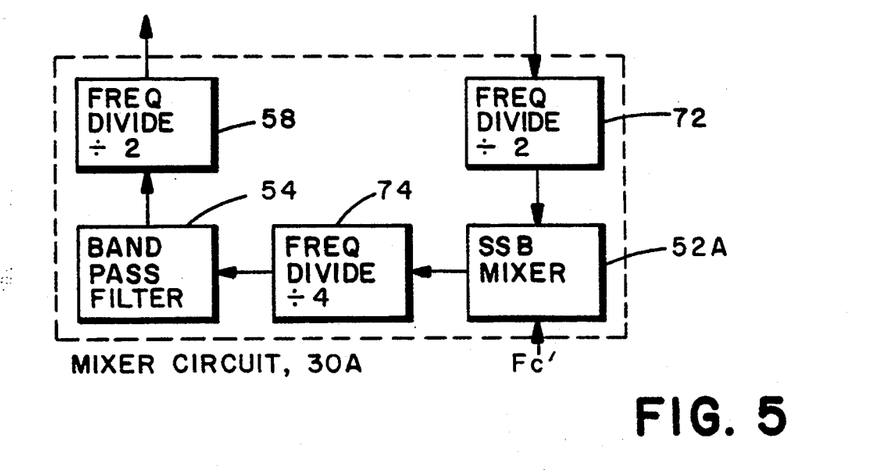
FIG. 5 shows diagrammatically a further embodiment of a mixer circuit of FIG. 3.

By way of alternative embodiments, it is noted that the band pass filter in the selector 16 can be located at the beginning of the frequency divider (FIG. 3) with a additional band pass filter located in the middle of a frequency divider as is shown in FIG. 4. Similarly, in the mixer circuit 30, the SSB mixer 52 can be located at the beginning of a frequency divider (FIG. 3) or in the middle of a frequency divider as is shown in FIG. 5. In FIG. 4, an alternative embodiment of comb line selector 16A comprises the band pass filter 48, a frequency divider 66 having a division ratio of 4, a second frequency divider 68 having a division ratio of 4, and a band pass filter 70 interconnecting the two dividers 66 and 68. The passband of the filter 70 is one quarter the size of the passband of the filter 48 (FIGS. 3, 4) because the values of the comb spectrum frequencies of the comb spectrum signals entering the selector 16A (FIG. 4) have been divided by four by operation of the divider 66. The total division ratio of the two dividers 66 and 68 is 16, this being the same ratio employed in the selector 16 (FIG. 3).

In FIG. 5, an alternative embodiment of mixer circuit 30A comprises a frequency divider 72 having a division ratio of 2, by way of example, a second frequency divider 74 having a division ratio of 4, with an SSB mixer 52A interconnecting the two dividers 72 and 74. The passband of the filter 54 is equal to the size of the passband of the corresponding filter 54 (FIG. 3) because the total division ratio of the two dividers 72 and 74 is 8, this being the same ratio provided by the divider 56 (FIG. 3). The SSB mixer 52A operates with a lower frequency input signal from the VCO 26 because of the division of frequency at the divider 72 by the factor of 2, and must also receive from the source 38 a smaller value Fc' of the fine tuning signal which is reduced in frequency by a factor of 2 to compensate for the frequency division of 2 in the divider 72. Otherwise, the SSB mixer 52A operates in the same fashion as does the SSB mixer 52 (FIG. 3).

The capacity of the synthesizer 10 for attenuating spurious frequency components, or spurs, depends on the spacing of spurs from the frequency of the desired signal within the PLL 20. One source of the spurs is within the DDS 60 with introduction of the spurs into the PLL 20 via the SSB mixer 52, and a second source of spurs results from the mixing operation of the input mixer 18 with the comb spectrum signals of the comb generation circuit 12.

In order to explain the function of the synthesizer 10 in attenuating the spurs, it is assumed, by way of example, that the DDS spurs are present at discrete locations, offset from an outputted carrier by multiples of the required DDS step size of 2.8 MHz. Furthermore, the SSB mixer 52 is presumed to provide a −15 dBc image level relative to the carrier, and that local oscillator (LO) leakage is at −10 dBc (below carrier). In view of the fact that the operation of a frequency divider can be understood, in part, to involve a sampling of the signal passing through the divider with a consequent aliasing of signal frequency components with sampling frequency, as is well known, it is advantageous to introduce filtering, by means of a band pass filter, just before the last divide-by-two divider stage in the feedback branch of the PLL 20, as is done by the filter 54 preceding the divider 58, and also by filtering the DDS output as is accomplished by the low pass filter 62.

Figure 6:
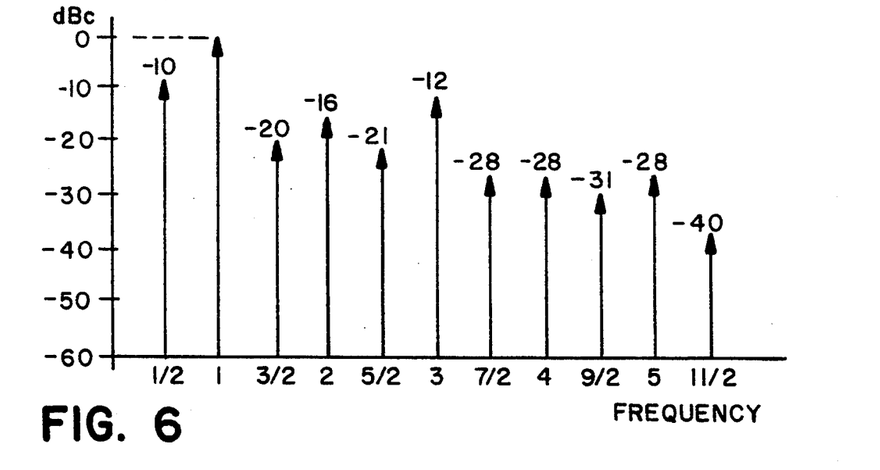
FIG. 6 is a diagram showing a typical spectrum of signals including lines of spurious signals outputted by a single sideband mixer of FIG. 3.
Figure 7A:
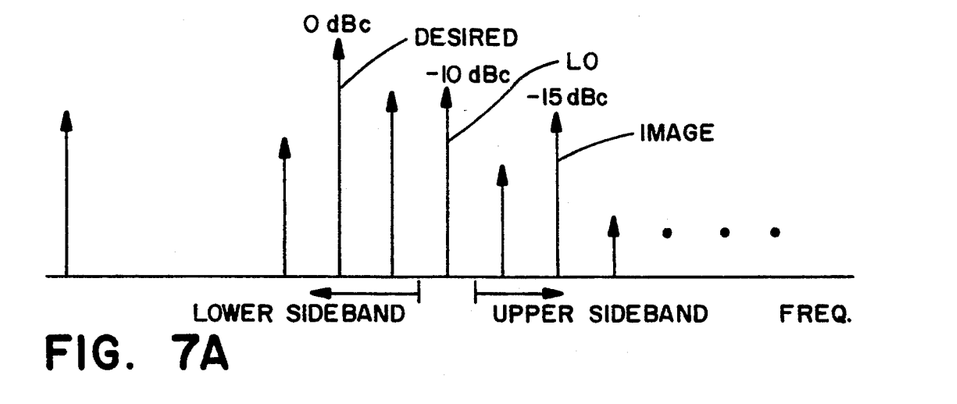
FIGS. 7A and 7B show detailed diagrams of spectra respectively of lower and upper sidebands of signals outputted by the single sideband mixer of FIG. 3.
Figure 7B:
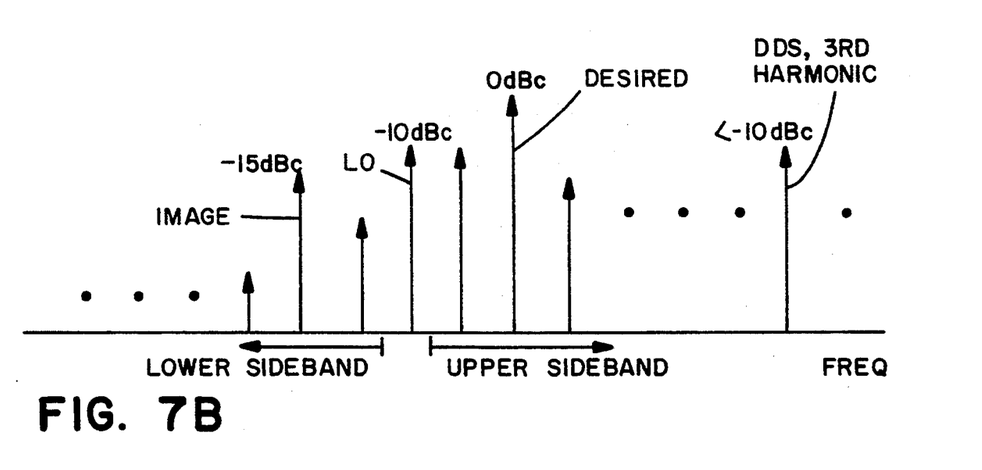

The SSB output of the mixer 52 may be regarded as consisting of a desired sideband, LO leakage, and an additional image signal of reduced amplitude having an image frequency spaced apart spectrally from the desired sideband. In this analysis, the LO signal corresponds to the signal outputted by the VCO 26 and applied by the coupler 28 to the SSB mixer 52. Spurious content of the desired and image signals are dominated by DDS spurs as is shown in FIG. 6 wherein the various signals are identified along the horizontal axis in terms of a fraction of the desired output frequency of the SSB mixer 52. Amplitude of each signal is indicated along the vertical axis in terms of decibels relative to the carrier, namely, the desired output signal of the mixer 52. The SSB output signals of the mixer 52 for the case of lower and upper sidebands are shown in FIGS. 7A and 7B, respectively, wherein lower and upper sideband frequencies are indicated along the horizontal axis, and relative amplitudes are indicated in the vertical direction.

The output of the SSB mixer 52 consists of a desired sideband plus plural distortion products. Since the desired output signal is significantly greater in amplitude than the other outputted signals, the divider chain of dividers 56 and 58 operates to enhance the desired signal with respect to the distortion. The first section of the divider chain, the divider 56 dividing by a factor of 8, shifts the desired signal to a lower frequency in the range of 770 to 840 MHz with respect to frequency values mentioned hereinabove for the preferred embodiment of the synthesizer 10. The range of 770 to 840 MHz defines the passband of the band pass filter 54, and includes any temperature drifts which may be present as well as filter tolerances and output frequency ranges. Alias bands established by a signal in the band of 770 to 840 MHz, prior to the final stage of division, includes distortion which is translated to the desired output frequency range of the synthesizer 10. In the event that a distortion signal lies exactly at a sampling harmonic (an integral multiple of the reference signal frequency of the source 14), the distortion signal will be aliased to a cross-over spur.

The effect of the last divider stage in the PLL 20 in producing distortion resulting in spurs relatively close to the carrier output of the synthesizer 10 is explained as follows. In the desired sideband, the third harmonic of the DDS is at −10 dBc and can be up to 720 MHz from the main frequency, thereby falling at 50 MHz from the minimum alias band at 770 MHz. After division, in the final stage, the spur lies at a 50 MHz offset. The PLL 20 filters the 50 MHz spur by 15 dB so that an additional 25 dB of filtering is required at a 720 MHz offset from desired frequency, to reduce the third harmonic induced spur to −50 dBc. A frequency between the third and the fourth harmonic as well as the fourth harmonic of the DDS output are attenuated to −25 dBc and can fall exactly at an alias frequency. As a result, the PLL 20 cannot filter out such frequencies, thereby requiring a 25 dB filtering at a 770 MHz offset from desired output frequency for optimum operation of the synthesizer 10.

In the image sideband, the main DDS frequency can lie up to 720 MHz from the main signal and have a power level less than −15 dBc. Aliasing puts this at 50 MHz minimum frequency spacing from the desired signal. The PLL 20 provides attenuation of 15 dB at 50 MHz from the desired signal. Thus, only 20 dB of filtering is required at 720 MHz from the desired signal. Higher frequency distortion in the image band is less than −25 dBc, but can fall exactly at an alias frequency, so that 25 dB additional filtering is required at a frequency distance of 770 MHz from the frequency of the desired signal for optimum operation of the synthesizer 10.

At the SSB mixer 52, the LO signal is at 180 to 360 MHz from the desired signal. LO leakage is at a relatively high level and represents a high modulation level of the desired signal. Aliasing of high level signals results in additional products at offsets equal to harmonics of the fundamental offset. LO leakage is attenuated by filtering to a low enough value to keep the second harmonic (which may result from high modulation index) from aliasing. A second LO harmonic may be as far from the desired signal, along the frequency axis, as 720 MHz, aliasing to within 50 MHz. The PLL 20 filters the 50 MHz spur by 15 dB so that the LO second harmonic should be less than −35 dBc. Filtering the LO to −20 dB sets the second harmonic well below −35 dBc, only 10 dB of filtering being required at 360 MHz from the desired signal.

Figure 8:
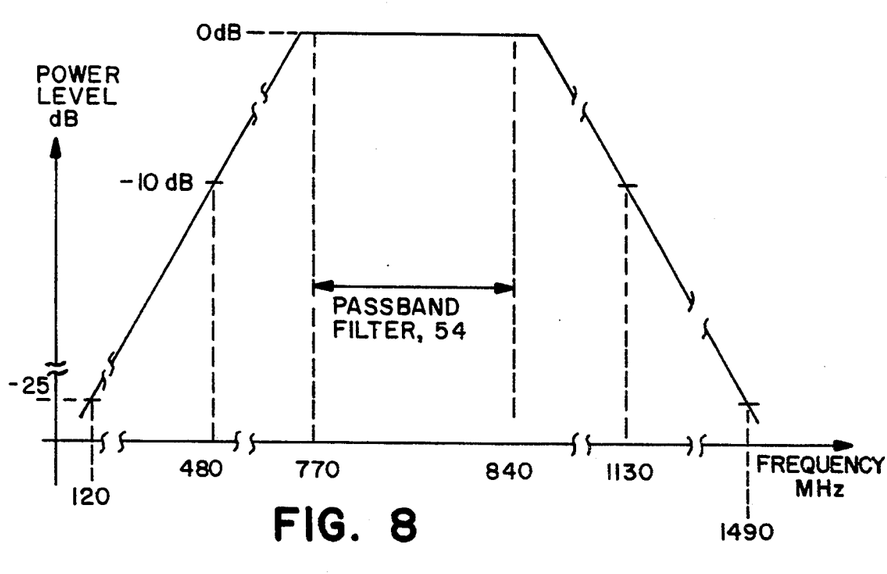
FIG. 8 shows filter requirements in a feedback path of FIG. 3 prior to a final frequency divider stage.
Figure 9:
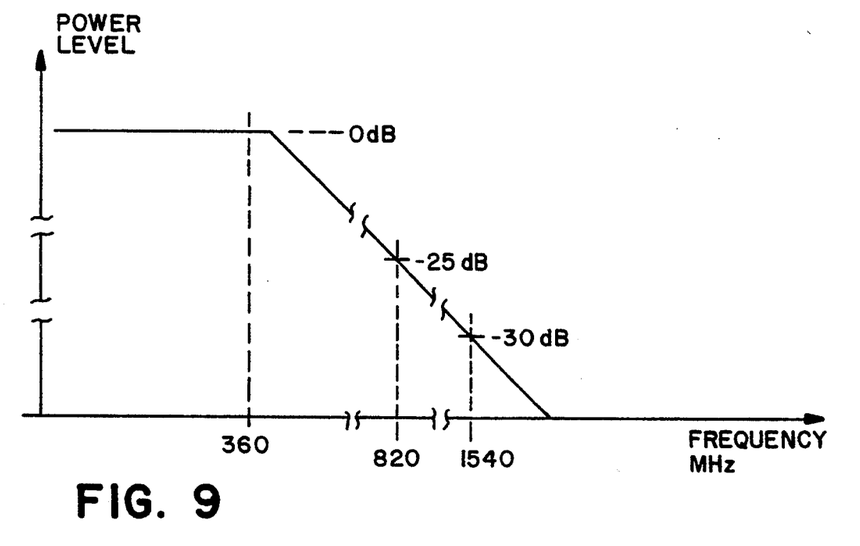
FIG. 9 shows filter requirements at an output of a direct digital frequency synthesizer of FIG. 3.

Filtering requirements are summarized in FIG. 8 for the signal in the feedback path of the PLL 20, at the input terminal of the last divider 58. Aliasing may occur in any of the divider stages, but is most prevalent in the last divider 58. By sufficiently limiting DDS high frequency spurs to meet the requirements for the second-to-the-last divider stage, requirements of preceding divider stages are also met. To meet the −50 dBc requirement in the desired sideband, DDS spurs at frequencies greater than 1540 MHz must have power levels less than −50 dBc. To meet image sideband requirements, a power level less than −35 dBc at 820 MHz is required. The DDS output filter requirements are summarized in FIG. 9.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A frequency synthesizer, comprising:
   a reference signal source which generates a reference signal having a reference frequency;
   a comb-frequency generator connected to said reference signal source and thereby receiving said reference signal, said comb-frequency generator outputting a plurality of comb spectrum signals characterized by respective comb spectrum frequencies which are respective integer multiples of said reference frequency;
   filter means, connected to said comb-frequency generator and thereby receiving said plurality of said comb spectrum frequencies, for selecting one signal from said plurality of comb spectrum signals, said one signal being at one frequency of said comb spectrum frequencies, said filter means outputting said one signal; and,
   a phase locked loop having
      a phase detector connected to said filter means and thereby receiving said one signal, said phase detector outputting a control signal,
      a voltage controlled oscillator (VCO) connected to said phase detector and thereby receiving said control signal, said VCO outputting a VCO output signal having an output power,
      a coupler connected to said VCO and thereby receiving said VCO output signal, said coupler outputting a first coupler output signal having substantially all of said output power, said coupler outputting a second coupler output signal having a remainder portion of said output power, and
      a single sideband (SSB) mixer circuit connected to said coupler and thereby receiving said second coupler output signal, said SSB mixer circuit outputting a feedback signal, said SSB mixer circuit being connected to said phase detector, whereby said phase detector receives said feedback signal.

2. The frequency synthesizer as claimed in claim 1, further comprising a fine tuning signal source which generates a fine tuning signal having a fine tuning frequency, said fine tuning signal source being connected to said SSB mixer circuit, said SSB mixer circuit thereby receiving said fine tuning signal, said SSB mixer circuit offsetting a frequency of said second coupler output signal by an amount of said fine tuning frequency.

3. The frequency synthesizer as claimed in claim 2 wherein:
   said SSB mixer circuit comprises
      an SSB mixer connected to said coupler and to said fine tuning signal source, said SSB mixer thereby receiving said second coupler output signal and said fine tuning signal, said SSB mixer offsetting said frequency of said second coupler output signal by said amount, said SSB mixer outputting an offset frequency signal, and
      a first frequency divider circuit connected in series between said SSB mixer and said phase detector; and,
   said filter means comprises
      a comb line band pass filter connected to said comb-frequency generator, and
      a second frequency divider circuit connected in series between said comb line band pass filter and said phase detector.

4. The frequency synthesizer as claimed in claim 3 wherein a frequency division ratio of said first frequency divider circuit is equal to a frequency division ratio of said second frequency divider circuit.

5. The frequency synthesizer as claimed in claim 3 wherein said first frequency divider circuit includes an SSB band pass filter, whereby spurious spectral lines of said offset frequency are attenuated.

6. The frequency synthesizer as claimed in claim 2, further comprising:
   an input mixer connected in series between said comb-frequency generator and said filter means;
   an output mixer connected to said coupler and thereby receiving said first coupler output signal, said output mixer outputting a synthesized frequency signal; and,
   a coarse tuning signal source connected to said input mixer and to said output mixer, said coarse tuning signal source outputting a coarse tuning signal having a coarse tuning frequency,
   said input mixer offsetting each of said comb spectrum frequencies by an amount of said coarse tuning frequency, whereby said one frequency of said comb spectrum frequencies is shifted in frequency to a frequency within a pass band of said filter means and whereby said one signal is selected,
   said output mixer offsetting a frequency of said first coupler output signal by said amount of said coarse tuning frequency in a direction opposite to said offset of said comb spectrum frequencies, whereby said synthesized frequency signal having a desired synthesized frequency is outputted.

7. The frequency synthesizer as claimed in claim 6 wherein:
   said SSB mixer circuit comprises
      an SSB mixer connected to said coupler and to said fine tuning signal source, said SSB mixer thereby receiving said second coupler output signal and said fine tuning signal, said second SSB mixer offsetting said frequency of said second coupler output signal by said amount, said SSB mixer outputting an offset frequency signal, and
      a first frequency divider circuit connected in series between said SSB mixer and said phase detector, said first frequency divider circuit including an SSB band pass filter, whereby spurious spectral lines of said offset frequency signal are attenuated; and,
   said filter means comprises
      a comb line band pass filter connected to said comb-frequency generator, and
      a second frequency divider circuit connected in series between said comb line band pass filter and said phase detector,
   said amount of said offset of said frequency of said second coupler output signal being less than a frequency spacing between adjacent frequencies of said comb spectrum frequencies.

* * * * *